US007952268B2

(12) United States Patent
Chien et al.

(10) Patent No.: US 7,952,268 B2

(45) Date of Patent: May 31, 2011

(54) ELECTROLUMINESCENT DEVICE

(75) Inventors: Yu-Han Chien, Hsinchu (TW); Shih-Chieh Hsu, Hsinchu (TW); Yu-Yang Chang, Hsinchu (TW); Cheng-Chung Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 368 days.

(21) Appl. No.: 12/185,205

(22) Filed: Aug. 4, 2008

(65) Prior Publication Data

US 2009/0039763 A1 Feb. 12, 2009

Related U.S. Application Data

(60) Provisional application No. 60/935,308, filed on Aug. 6, 2007.

(51) Int. Cl.
*H01L 51/00* (2006.01)

(52) U.S. Cl. ........................................ 313/503; 313/506

(58) Field of Classification Search ........... 313/498–512
See application file for complete search history.

(56) References Cited

U.S. PATENT DOCUMENTS 6,589,674 B2 * 7/2003 Li et al. ......................... 428/690

* cited by examiner

*Primary Examiner* — Anne M Hines

(74) *Attorney, Agent, or Firm* — Birch, Stewart, Kolasch & Birch, LLP

(57) ABSTRACT

An electroluminescent device includes a first electrode layer, a phosphor layer on the first electrode layer, a layer with permanent accumulated charges on the phosphor layer, and a second electrode layer on the layer with permanent accumulated charges. By the addition of the layer with permanent accumulated charges, an external driving voltage applied to the luminescent device can be reduced.

18 Claims, 3 Drawing Sheets

ELECTROLUMINESCENT DEVICE

CROSS-REFERENCE TO RELATED APPLICATION

This application claims the benefit of the filing date of provisional application No. 60/935,308 filed Aug. 6, 2007, under 35 USC §119(e)(1).

BACKGROUND OF THE INVENTION

1. Field of the Invention

The present invention relates to an electroluminescent device.

2. Description of the Related Art

Electroluminescence (EL) is the emission of light from a phosphor layer due to the application of an electric field. Electroluminescent devices (EL) have utility as lamps and displays. FIG. 1 is a schematic cross-sectional view of a conventional electroluminescent device, which includes a bottom substrate 100, a first electrode layer 101 formed on the bottom substrate 100, a phosphor layer 102 formed on the first electrode layer 101, and a second electrode layer 103 formed on the phosphor layer 102. An AC power is connected to the first electrode layer 101 and the second electrode layer 103 to drive the electroluminescent device. In case of yellowish light emission, the phosphor layer 102 can be formed of sintered pellets of ZnS (parent material) doped with Mn (illuminating centers) as a dopant by way of electron beam vapor deposition, sputtering, screen printing, spin coating or ink-jet printing etc. As other sintered pellets for the phosphor layer 102, sintered pellets of ZnS doped with $TbF_3$ or TbP as a dopant for green light emission, those doped with $TmF_3$ for blue light emission are also available. In lamp applications, both of the first electrode layer 101 and second electrode layer 103 take the form of continuous layers, thereby subjecting the entire phosphor layer 102 between the two electrode layers to the electric field. In a typical display application, the first electrode layer 101 and second electrode layer 103 are suitably patterned with electrically address lines defining row and column electrodes (not shown). Pixels are defined where the row and column electrodes overlay. Upon applying an electric field onto the electroluminescent device, electrons from the first electrode layer 101 are accelerated by the electric field as they pass through the phosphor layer 102. The outer-shell electrons of the illuminating centers of the phosphor layer 102 are collided with the accelerated primary electrons, causing the outer-shell electrons transferring to the conduction band of the parent material to form free electrons, and the illuminating centers are ionized. The free electrons and ionized illuminating centers are recombined, and the energy difference there between are released in a form of light.

The conventional electroluminescent device still has problems such as a high driving voltage and low emission brightness. Thus, research and development of the electroluminescent device have been extensively made for improvement of light emission characteristics.

SUMMARY OF THE INVENTION

The present invention provides an electroluminescent device including a first electrode layer, a phosphor layer on the first electrode layer, a layer with permanent accumulated charges on the phosphor layer, and a second electrode layer on the layer with permanent accumulated charges.

The present invention provides another kind of electroluminescent device including a first electrode layer, a phosphor layer on the first electrode layer, a second electrode layer on the phosphor layer and a layer with permanent accumulated charges on the second electrode layer.

DETAILED DESCRIPTION OF THE PREFERRED EMBODIMENTS

The present invention provides an electroluminescent device by the addition of a layer with permanent accumulated charges to increase excitation energy to a phosphor layer in the electroluminescent device so as to reduce an external driving voltage.

The present invention provides an electroluminescent device, which includes a substrate, a lower electrode layer positioned over the substrate, a phosphor layer positioned over the lower electrode layer, an upper electrode layer positioned over the phosphor layer, and a layer with permanent accumulated charges being inserted between the phosphor layer and the lower electrode layer or between the phosphor layer and the upper electrode layer. The layer with permanent accumulated charges also can be positioned under the lower electrode layer or over the upper electrode layer. The present electroluminescent device also can have one layer with permanent accumulated charges positioned close to the lower electrode layer and another layer with permanent accumulated charges positioned close to the upper electrode layer. The substrate can be opaque or transparent. The lower electrode layer can be formed of transparent conductive material or reflective conductive material, depending on the substrate. When the substrate is opaque, the lower electrode layer is preferably formed of the reflective conductive material. When the substrate is transparent, which can be served as an illuminating surface, and the lower electrode layer is formed of transparent conductive material.

The electroluminescent device of the present invention will be described in detail according to following embodiments with accompanying drawings.

Figure 1:
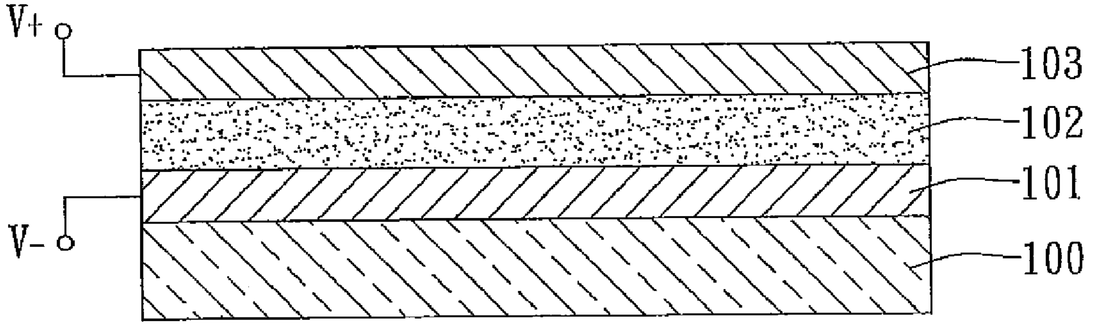
Fig. 1 (Prior Art)
FIG. 1 is a schematic cross-sectional view of a conventional electroluminescent device.
Figure 2:
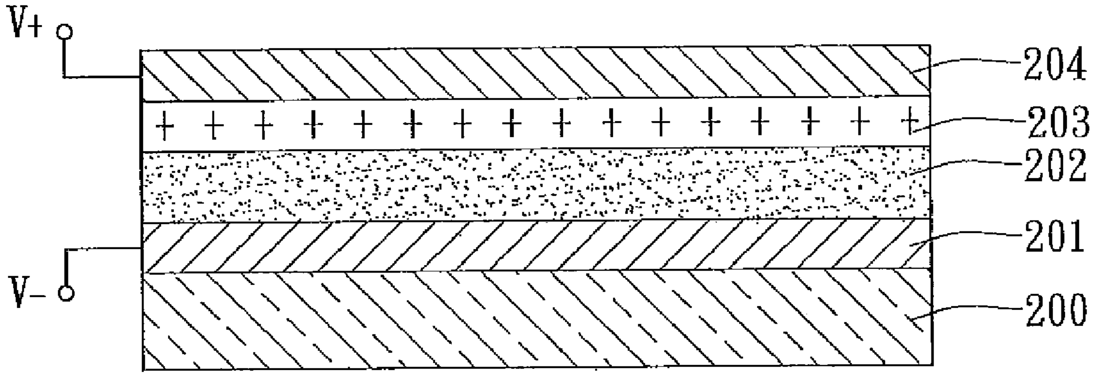
FIG. 2 is a schematic cross-sectional view of an electroluminescent device according to a first embodiment of the present invention.

FIG. 2 is a schematic cross-sectional view of an electroluminescent device according to a first embodiment of the present invention. In the first embodiment, a first electrode layer 201 by sputtering, electron beam vapor deposition, screen printing, spin coating or ink-jet printing etc., is formed on a bottom substrate 200. The first electrode layer 201 is a reflective material such as Au, Ag or Al etc. A phosphor layer 202 is formed on the first electrode layer 201 by way of electron beam vapor deposition, sputtering, screen printing, spin coating or ink-jet printing etc. The phosphor layer 202 can include sintered pellets of ZnS (parent material) doped with Mn (illuminating centers) as a dopant (ZnS:Mn). As other sintered pellets for the phosphor layer 202, sintered pellets of ZnS doped with $TbF_3$ or TbP as a dopant (ZnS: $TbF_3$; ZnS: TbP) can be used for green light emission, those doped with $TmF_3$ (ZnS: $TmF_3$) for blue light emission are also can be used. A layer with permanent accumulated charges 203 is formed on the phosphor layer 202. The layer with permanent accumulated charges 203 can be an electret layer with charges. A transparent second electrode layer 204 such as an ITO or IZO electrode layer is formed on the layer with permanent accumulated charges 203. The power source of the electroluminescent device can be a DC power supply. The electroluminescent device as shown in FIG. 2 can be considered a capacitor with a pair of plate electrodes. It is known that the energy stored in the capacitor is calculated by the formula of $E_{stored}=\frac{1}{2}VQ$, where Q is electric charges accumulated on the plate electrodes and V is the voltage difference between the plate electrodes, either of Q or V increases, $E_{stored}$ is then increased. In the first embodiment, the layer with permanent accumulated charges 203 is added in the electroluminescent device to induce an electric field in the electroluminescent device, and thus an external electric field to be applied to the electroluminescent device to stimulate light emission can be lowered. As a result, an external driving voltage is reduced. In other words, the electroluminescent device according to the first embodiment would have a driving voltage lower than the conventional electroluminescent device. Even the external driving voltage is kept the same as the conventional electroluminescent device; the excitation energy to the phosphor layer 202 is increased by the addition of the layer with permanent accumulated charges 203. The emission efficiency of the phosphor layer 202 is thus improved to increase the emission brightness of the electroluminescent device. During operation of the device, electrons from the first electrode layer 201 are accelerated by electric field to pass through the phosphor layer 202. The outer-shell electrons of the illuminating centers of the phosphor layer 202 are collided with the accelerated primary electrons, causing the outer-shell electrons transferring to the conduction band of the parent material to form free electrons, and the illuminating centers are ionized. The free electrons and ionized illuminating centers are recombined, and the energy difference in-between is released in a form of light.

Alternatively, the positions of the layer with permanent accumulated charges 203 and the transparent second electrode layer 204 can be exchanged to each other (not shown in the drawing). In other words, the transparent second electrode layer 204 can be formed on the phosphor layer 202, and the layer with permanent accumulated charges 203 overlays the transparent second electrode layer 204.

When the electroluminescent device is used in a display panel, the first electrode layer 201 and the second electrode layer 204 are etched with desired patterns by photo-etching to obtain appropriate electrode patterns for the electroluminescent device. Each intersection of the electrode patterns of the first electrode layer 201 and the second electrode layer 204 defines a pixel area.

Additionally, in the first embodiment, the power source can be an AC power supply. In this situation, the accumulated charges of the layer with permanent accumulated charges 203 are not restricted to positive charges. In other words, the layer with permanent accumulated charges 203 of FIG. 2 can be an electret layer with positive charges or replaced by an electret layer with negative charges. The polarities of the first electrode layer 201 and the second electrode layer 204 are changed as the polarity of the AC power supply applied thereupon.

Figure 3:
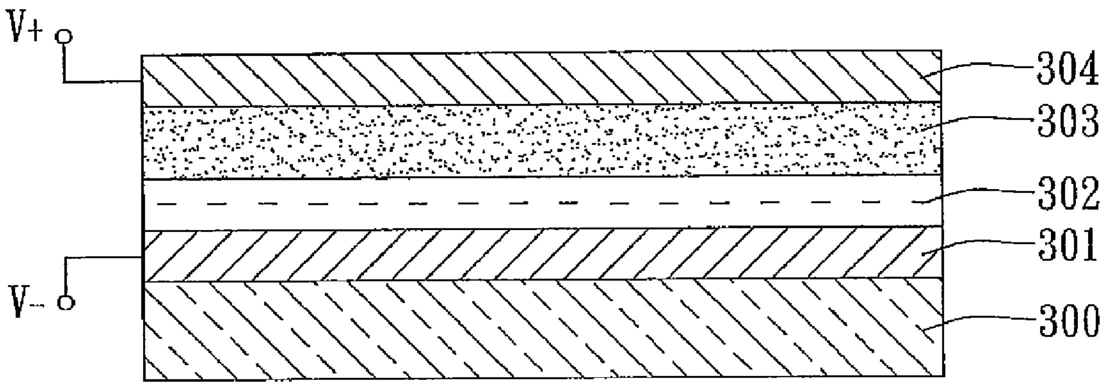
FIG. 3 is a schematic cross-sectional view of an electroluminescent device according to a second embodiment of the present invention.

FIG. 3 is a schematic cross-sectional view of an electroluminescent device according to a second embodiment of the present invention. In the second embodiment, a first electrode layer 301 by sputtering, electron beam vapor deposition, screen printing, spin coating or ink-jet printing etc. is formed on a bottom substrate 300. The first electrode layer 301 is a reflective material such as Au, Ag or Al etc. A layer with permanent accumulated charges 302 is formed on the first electrode layer 301. The layer with permanent accumulated charges 302 can be an electret layer with charges. A phosphor layer 303 is formed on the layer with permanent accumulated charges 302 by way of electron beam vapor deposition, sputtering, screen printing, spin coating or ink-jet printing etc. The phosphor layer 303 can include sintered pellets of ZnS (parent material) doped with Mn (illuminating centers) as a dopant. As other sintered pellets for the phosphor layer 303, sintered pellets of ZnS doped with $TbF_3$ or TbP as a dopant can be used for green light emission, those doped with $TmF_3$ for blue light emission are also can be used. A transparent second electrode layer 304 such as an ITO or IZO electrode layer is formed on the phosphor layer 303. During operation of the device, electrons from the first electrode layer 301 are accelerated by electric field to pass through the phosphor layer 303. The outer-shell electrons of the illuminating centers of the phosphor layer 303 are collided with the accelerated primary electrons, causing the outer-shell electrons transferring to the conduction band of the parent material to form free electrons, and the illuminating centers are ionized. The free electrons and ionized illuminating centers are recombined, and the energy difference in-between is released in a form of light. The power source of the electroluminescent device of FIG. 3 can be a DC power supply but also can be replaced by an AC power supply. When the power source is an AC power supply, the accumulated charges of the layer with permanent accumulated charges 302 are not restricted to negative charges. In other words, the layer with permanent accumulated charges 302 can be an electret layer with negative charges or replaced by an electret layer with positive charges. The polarities of the first electrode layer 301 and the second electrode layer 304 are changed as the polarity of the AC power supply applied thereupon.

Alternatively, the positions of the layer with permanent accumulated charges 302 and the first electrode layer 301 can be exchanged to each other (not shown in the drawing). In other words, the layer with permanent accumulated charges 302 can be formed on the bottom substrate 300, and the first electrode layer 301 is formed on the layer with permanent accumulated charges 302. Similarly, when the power source of the electroluminescent device is an AC power supply, a layer with permanent accumulated positive or negative charges can be placed between the bottom substrate 300 and the first electrode layer 301 (not shown in the drawing). The polarities of the first electrode layer 301 and the second electrode layer 304 are changed as the polarity of the AC power supply applied thereupon.

Alternatively, in the present electroluminescent device, a dielectric layer can be added between the phosphor layer and either of the first electrode layer and the second electrode layer, or between the phosphor layer and each of the first electrode layer and the second electrode layer.

Figure 4:
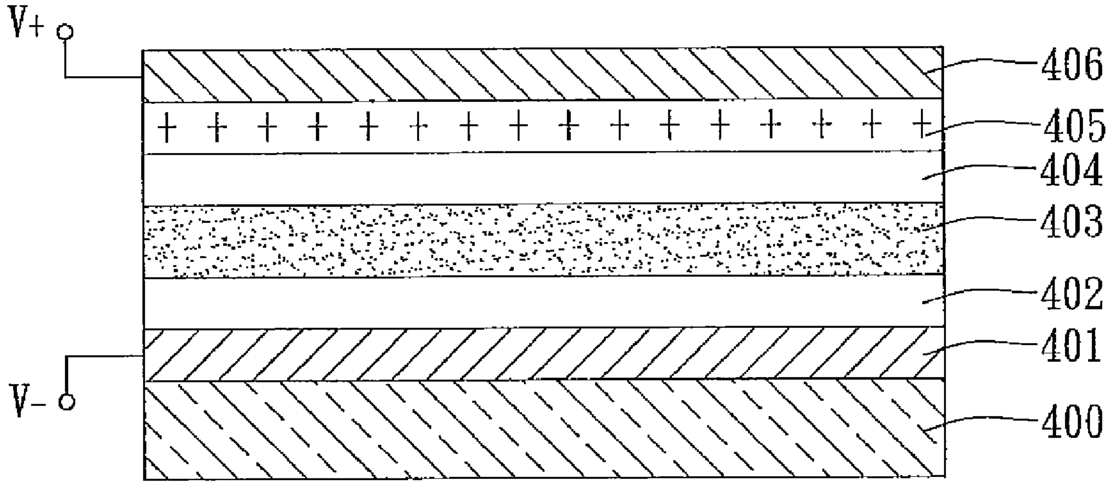
FIG. 4 is a schematic cross-sectional view of an electroluminescent device according to a third embodiment of the present invention.

FIG. 4 is a schematic cross-sectional view of an electroluminescent device according to a third embodiment of the present invention. In the third embodiment, a first electrode layer 401 by sputtering, electron beam vapor deposition, screen printing, spin coating or ink-jet printing etc. is formed on a bottom substrate 400. The first electrode layer 401 is a reflective material such as Au, Ag or Al etc. A first dielectric layer 402 is formed by sputtering or electron beam vapor deposition on the first electrode layer 401. It is preferable that the first dielectric layer 402 has a high dielectric constant to lower the driving voltage. Exemplary materials for the first dielectric layer 402 include $BaTiO_3$, $SrTiO_3$, $PbTiO_3$ and $PbNbO_3$ etc. A phosphor layer 403 is formed on the first dielectric layer 402 by way of electron beam vapor deposition, sputtering, screen printing, spin coating or ink-jet printing etc. The phosphor layer 403 can include sintered pellets of ZnS (parent material) doped with Mn (illuminating centers) as a dopant. As other sintered pellets for the phosphor layer 403, sintered pellets of ZnS doped with $TbF_3$ or TbP as a dopant can be used for green light emission, those doped with $TmF_3$ for blue light emission are also can be used. A second dielectric layer 404 of the material similar to that used in the first dielectric layer 402 is formed on the phosphor layer 403. A layer with permanent accumulated charges 405 is formed on the second dielectric layer 404. The layer with permanent accumulated charges 405 is transparent and can be an electret layer. A transparent second electrode layer 406 such as an ITO or IZO electrode layer is formed on the layer with permanent accumulated charges 405. During operation of the device, electrons from the interface between the first dielectric layer 402 and the phosphor layer 403 are accelerated by electric field to pass through the phosphor layer 403. The outer-shell electrons of the illuminating centers of the phosphor layer 403 are collided with the accelerated primary electrons, causing the outer-shell electrons transferring to the conduction band of the parent material to form free electrons, and the illuminating centers are ionized. The free electrons and ionized illuminating centers are recombined, and the energy difference in-between is released in a form of light. The second dielectric layer 404 is served as a protection layer for preventing the electrons from the interface between the first dielectric layer 402 and the phosphor layer 403 from being drawn to the layer with permanent accumulated charges 405. The power source of the electroluminescent device of FIG. 4 can be a DC power supply, but also can be an AC power supply instead of the DC power supply. When the power source is an AC power supply, the accumulated charges of the layer with permanent accumulated charges 405 are not restricted to positive charges. In other words, the layer with permanent accumulated charges 405 can be an electret layer with positive charges or replaced by an electret layer with negative charges. The polarities of the first electrode layer 401 and the second electrode layer 406 are changed as the polarity of the AC power supply applied thereupon.

In a variance of the third embodiment, either of the first dielectric layer 402 and the second dielectric layer 404 can be omitted from the structure of the electroluminescent device (not shown in the drawings). In another variance of the third embodiment, a layer with permanent accumulated charges is placed between the first electrode layer 401 and the first dielectric layer 402. Similarly, when the power source of the electroluminescent device is an AC power supply, the accumulated charges of the layer with permanent accumulated charges are not restricted to positive or negative charges. In other words, the layer with permanent accumulated charges can be an electret layer with positive or negative charges. The polarities of the first electrode layer 401 and the second electrode layer 406 are changed as the polarity of the AC power supply applied thereupon.

Figure 5:
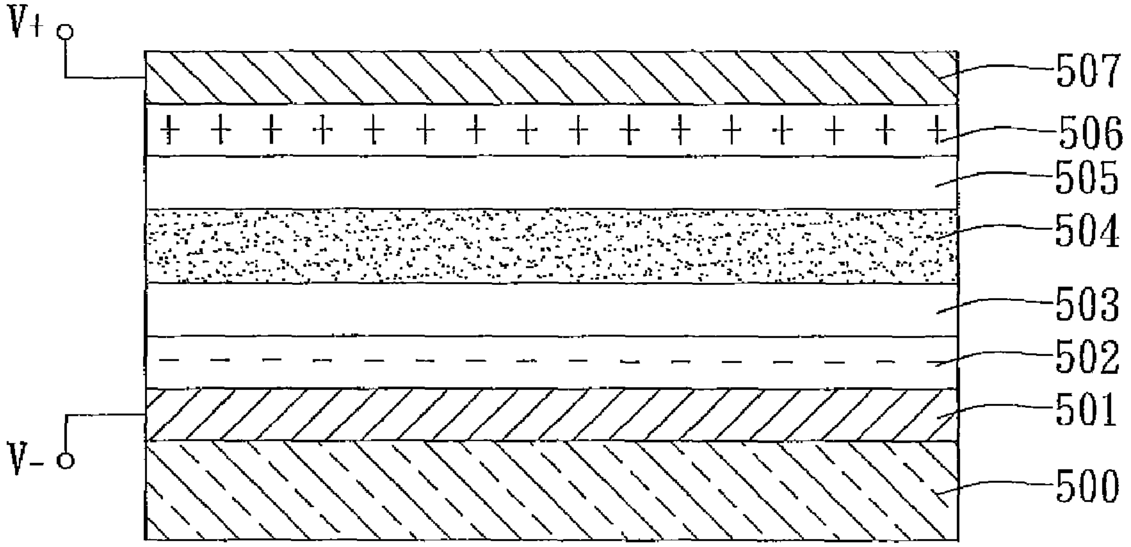
FIG. 5 is a schematic cross-sectional view of an electroluminescent device according to a fourth embodiment of the present invention.

FIG. 5 is a schematic cross-sectional view of an electroluminescent device according to a fourth embodiment of the present invention. In the fourth embodiment, a first electrode layer 501 by sputtering, electron beam vapor deposition, screen printing, spin coating or ink-jet printing etc. is formed on a bottom substrate 500. The first electrode layer 501 is a reflective material such as Au, Ag or Al etc. A layer with permanent accumulated charges 502, such as an electret layer with accumulated charges, is formed on the first electrode layer 501. A first dielectric layer 503 is formed on the layer with permanent accumulated charges 502. It is preferable that the first dielectric layer 503 has a high dielectric constant to lower the driving voltage. Exemplary materials for the first dielectric layer 503 include $BaTiO_3$, $SrTiO_3$, $PbTiO_3$ and $PbNbO_3$ etc. A phosphor layer 504 is formed on the first dielectric layer 503. The phosphor layer 504 can include sintered pellets of ZnS (parent material) doped with Mn (illuminating centers) as a dopant. As other sintered pellets for the phosphor layer 504, sintered pellets of ZnS doped with $TbF_3$ or TbP as a dopant can be used for green light emission, those doped with $TmF_3$ for blue light emission are also can be used. A second dielectric layer 505 of the material similar to that used in the first dielectric layer 503 is formed on the phosphor layer 504. A layer with permanent accumulated charges 506, such as an electret layer with accumulated charges, is formed on the second dielectric layer 505. A transparent second electrode layer 507 such as an ITO or IZO electrode layer is formed on the layer with permanent accumulated charges 506. During operation of the device, electrons from the interface between the first dielectric layer 503 and the phosphor layer 504 are accelerated by the electric field to pass through the phosphor layer 504. The outer-shell electrons of the illuminating centers of the phosphor layer 504 are collided with the accelerated primary electrons, causing the outer-shell electrons transferring to the conduction band of the parent material to form free electrons, and the illuminating centers are ionized. The free electrons and ionized illuminating centers are recombined, and the energy difference in-between is released in a form of light. The second dielectric layer 505 is served as a protection layer for preventing the electrons from the interface between the first dielectric layer 503 and the phosphor layer 504 from being drawn to the layer with permanent accumulated charges 506. In this embodiment, the induced electric field strength generated by the two layers with permanent accumulated charges is double the device as shown in FIG. 2 through FIG. 4. The device as shown in FIG. 5 requires less external driving voltage than the devices shown in FIG. 2 through FIG. 4. The power source of the electroluminescent device of FIG. 5 can be a DC power supply, but also can be an AC power supply instead of the DC power supply. When the power source is an AC power supply, the polarities of the first electrode layer 501 and the second electrode layer 507 are changed as the polarity of the AC power supply applied thereupon. The positions of the layer with permanent accumulated charges 502 and the layer with permanent accumulated charges 506 can be exchanged to each other (not shown in the drawing).

The electroluminescent devices of the above embodiments and their variances can be used in display panels, their first electrode layers and second electrode layers are etched with desired patterns by photo-etching to obtain appropriate electrode patterns. Each intersection of the electrode patterns of the first electrode layer and the second electrode layer defines a pixel area.

In a variance of the fourth embodiment, either of the first dielectric layer 503 and the second dielectric layer 505 can be omitted from the structure of the electroluminescent device (not shown in the drawings).

The present invention integrates the formation step of the layer with permanent accumulated charges in the manufacturing process of the conventional electroluminescent device. The driving voltage of the electroluminescent device is thus reduced by the addition of the layer with permanent accumulated charges. The manufacturing cost of the electroluminescent device can be significantly lowered. The utility of the electroluminescent device also can be extended.

While the invention has been described by way of examples and in terms of embodiments, it is to be understood that those who are familiar with the subject art can carry out various modifications and similar arrangements and procedures described in the present invention and also achieve the effectiveness of the present invention. Hence, it is to be understood that the description of the present invention should be accorded with the broadest interpretation to those who are familiar with the subject art, and the invention is not limited thereto.

What is claimed is:

1. An electroluminescent device, comprising:

a first electrode layer;

a phosphor layer on said first electrode layer;

an electret layer with permanent accumulated charges on said phosphor layer; and a second electrode layer on said layer with permanent accumulated charges.

2. The electroluminescent device as claimed in claim 1, wherein further comprises a power source being a DC power supply or an AC power supply.

3. The electroluminescent device as claimed in claim 2, wherein when said power source of said electroluminescent device is an AC power supply, said layer with permanent accumulated charges is an electret layer with positive charges or an electret layer with negative charges.

4. The electroluminescent device as claimed in claim 1, wherein further comprises a first dielectric layer placed between said first electrode layer and said phosphor layer.

5. The electroluminescent device as claimed in claim 4, wherein further comprises a second dielectric layer placed between said phosphor layer and said layer with permanent accumulated charges.

6. The electroluminescent device as claimed in claim 1, wherein further comprises a second dielectric layer placed between said phosphor layer and said layer with permanent accumulated charges.

7. The electroluminescent device as claimed in claim 1, further comprising one another layer with permanent accumulated charges between said first electrode layer and said phosphor layer.

8. The electroluminescent device as claimed in claim 7, wherein said another layer with permanent accumulated charges includes an electret layer.

9. The electroluminescent device as claimed in claim 7, further comprising a first dielectric layer placed between said electret layer with permanent accumulated charges and said phosphor layer and a second dielectric layer placed between said phosphor layer and said one another layer with permanent accumulated charges.

10. The electroluminescent device as claimed in claim 1, wherein said electroluminescent device is served as a display panel.

11. An electroluminescent device, comprising:

a first electrode layer;

a phosphor layer on said first electrode layer;

a second electrode layer on said phosphor layer; and an electret layer with permanent accumulated charges on said second electrode layer.

12. The electroluminescent device as claimed in claim 11, wherein further comprises a power source being a DC power supply or an AC power supply.

13. The electroluminescent device as claimed in claim l2, wherein when said power source of said electroluminescent device is an AC power supply, said layer with permanent accumulated charges is an electret layer with positive charges or an electret layer with negative charges.

14. The electroluminescent device as claimed in claim 11, further comprising one another layer with permanent accumulated charges under said first electrode layer.

15. The electroluminescent device as claimed in claim 11, further comprising a first dielectric layer between said first electrode layer and said phosphor layer.

16. The electroluminescent device as claimed in claim 15, further comprising a second dielectric layer between said second electrode layer and said phosphor layer.

17. The electroluminescent device as claimed in claim 11, further comprising a second dielectric layer between said second electrode layer and said phosphor layer.

18. The electroluminescent device as claimed in claim 11, wherein said electroluminescent device is served as a display panel.

* * * * *